(12) United States Patent
Yau et al.

(10) Patent No.: US 11,361,504 B2
(45) Date of Patent: Jun. 14, 2022

(54) METHOD FOR GENERATING 3D DIGITAL MODEL, PHYSICAL MOLD USED IN HAIRPIECE MANUFACTURING AND METHOD FOR GENERATING THE SAME

(71) Applicant: TRUE HAIR LLC, Somerville, MA (US)

(72) Inventors: Shing-Tung Yau, Somerville, MA (US); Eugene M. Yau, Somerville, MA (US); Dale Owen Royer, Somerville, MA (US)

(73) Assignee: TRUE HAIR LLC, Sommervlle, MA (US)

(*) Notice: Subject to any disclaimer, the term of this patent is extended or adjusted under 35 U.S.C. 154(b) by 40 days.

(21) Appl. No.: 16/639,536

(22) PCT Filed: Aug. 13, 2018

(86) PCT No.: PCT/US2018/046430
§ 371 (c)(1),
(2) Date: Feb. 14, 2020

(87) PCT Pub. No.: WO2019/036327
PCT Pub. Date: Feb. 21, 2019

(65) Prior Publication Data
US 2021/0174582 A1    Jun. 10, 2021

Related U.S. Application Data

(60) Provisional application No. 62/545,762, filed on Aug. 15, 2017.

(51) Int. Cl.
*G06T 17/20* (2006.01)
*G06T 15/08* (2011.01)
(Continued)

(52) U.S. Cl.
CPC ............ *G06T 17/20* (2013.01); *A41G 3/0075* (2013.01); *G06F 30/10* (2020.01); *G06T 15/08* (2013.01);
(Continued)

(58) Field of Classification Search
CPC .... G06T 2219/008; G06T 15/08; G06T 17/20
See application file for complete search history.

(56) References Cited

U.S. PATENT DOCUMENTS

2009/0231336 A1   9/2009   Dilbeck et al.
2009/0248184 A1   10/2009  Steingart et al.
(Continued)

FOREIGN PATENT DOCUMENTS

WO   2016195488 A1   12/2016

OTHER PUBLICATIONS

International Search Report and Written Opinion issued in corresponding International Application No. PCT/US2018/046430 dated Dec. 14, 2018, U.S. Patent and Trademark Office, Alexandria, VA.

*Primary Examiner* — Matthew Salvucci
(74) *Attorney, Agent, or Firm* — Hauptman Ham, LLP

(57) ABSTRACT

The present disclosure provides a method for generating a 3D digital model used in hairpiece manufacturing is provided, which comprises: obtaining an initial 3D model of a head; identifying an outline of a target area to be covered by a hairpiece on the initial 3D model; and cutting the initial 3D model based at least partially on the target area to obtain a refined 3D model. A physical mold used in hairpiece manufacturing and a method for generating the same are also provided according to other aspects of the present disclosure.

14 Claims, 7 Drawing Sheets

(51) Int. Cl.
*G06F 30/10* (2020.01)
*G06T 19/20* (2011.01)
*A41G 3/00* (2006.01)

(52) U.S. Cl.
CPC ........ *G06T 19/20* (2013.01); *G06T 2219/008* (2013.01)

(56) References Cited

U.S. PATENT DOCUMENTS

| | | |
|---|---|---|
| 2015/0035945 A1* | 2/2015 | Zhang .................. H04N 13/204 348/46 |
| 2016/0148435 A1 | 5/2016 | Li et al. |
| 2017/0065061 A1 | 3/2017 | McArthur et al. |
| 2017/0270709 A1* | 9/2017 | Tran ....................... A43B 13/04 |
| 2018/0149886 A1* | 5/2018 | Zweerts ............... G02C 13/003 |
| 2019/0035149 A1* | 1/2019 | Chen ......................... G06T 7/50 |

* cited by examiner

METHOD FOR GENERATING 3D DIGITAL MODEL, PHYSICAL MOLD USED IN HAIRPIECE MANUFACTURING AND METHOD FOR GENERATING THE SAME

This disclosure relates to custom manufacturing of hairpieces. In particular, this disclosure relates to a method for generating a 3D digital model used in hairpiece manufacturing, a physical mold used in hairpiece manufacturing and a method for generating a physical mold.

BACKGROUND

Many individuals lose naturally growing hair due to, for example, diseases or aging, or just by heredity. Hairpieces provide an important way for improving/changing one's appearance. Previously, an area on one's head, large or small, in which hair is lost, was first outlined and measured, and a hairpiece formed on a flat base material is tailored to the size of this area and then attached to the head to cover the area, by means of, for example, gluing or braiding. One problem with this approach is that, the base material of the hairpiece is flat in shape and when it is attached to the head, creases occur and cause the hairpiece not to fit the curved shape of a head shell very well. It may look bad or cause a loose/unstable attachment of hairpiece to a head.

In consideration of the above, custom made hairpieces have been proposed. For manufacturing a custom made hairpiece, a physical mold of a head is usually produced in accordance to the shape and size of a customer's head shell at a mold factory, and then shipped to a hairpiece factory, where a hairpiece is custom made by using the physical mold and can be made to fit the mold and thus fit the customer's head well.

Usually, the physical mold is a mold of the entire head or at least a majority of a head where hair is supposed to grow. One problem in this approach is that, too much material is used for the physical mold, causing higher cost in both mold manufacturing and shipping, and at the same time, the process for manufacturing a physical mold is unnecessarily long and complicated.

Furthermore, nowadays, both 3D printing and milling are available means for 3D mold manufacturing. However, not all 3D molds can be manufactured by 3D printing or milling due to geometry characteristics of the mold design. Therefore, more consideration needs to be given to the design of the mold.

SUMMARY

Aspects of the present disclosure address some of the problems described above.

In one aspect of the present disclosure, a method for generating a 3D digital model used in hairpiece manufacturing is provided, which comprises: obtaining an initial 3D model of a head; identifying an outline of a target area to be covered by a hairpiece on the initial 3D model; and cutting the initial 3D model based at least partially on the target area to obtain a refined 3D model.

In another aspect of the present disclosure, a method for generating a physical mold used in hairpiece manufacturing is provided, which comprises: obtaining an initial 3D model of a head; identifying an outline of a target area to be covered by a hairpiece on the initial 3D model; cutting the initial 3D model based at least partially on the target area to obtain a refined 3D model; and generating a physical mold based on the refined 3D model.

In another aspect of the present disclosure, a physical mold used in hairpiece manufacturing is provided, which comprises a body having a bottom surface and a top surface, wherein the top surface is corresponding to only a part of a head shell, and contains a target area to be covered by a hairpiece, and the top surface has a top boundary that is set based at least partially on the target area.

In yet another aspect of the present disclosure, one or more processor readable storage devices are provided, which have encoded thereon instructions for causing one or more processors to perform the method for generating a 3D digital model used in hairpiece manufacturing as described above.

In yet another aspect of the present disclosure, a system for generating a 3D digital model used in hairpiece manufacturing is provided, which comprises: one or more processors and one or more processor readable storage devices, wherein the one or more processor readable storage devices have encoded thereon instructions for causing the one or more processors to perform the method for generating a 3D digital model used in hairpiece manufacturing as described above.

BRIEF DESCRIPTION OF THE DRAWINGS

Other features, objects, and advantages of the present disclosure will become more apparent from the following detailed description when taken in conjunction with the accompanying drawings, in which.

DETAILED DESCRIPTION

The present application will now be described in further detail with reference to the accompanying drawings and examples. It is to be understood that the specific embodiments described herein are for the purpose of explaining the related invention and are not intended to limit the invention.

It should also be noted that, for the sake of convenience of description, only parts related to the invention are shown in the accompanying drawings. Specifically, the embodiments in the present application and the features in the embodiments can be combined with each other without conflict.

The expression "exemplary", "example", or various forms thereof are used herein to mean serving as an example, instance, or illustration. Any aspect or design described herein as "exemplary" or as an "example" is not necessarily to be construed as preferred or advantageous over other aspects or designs. Furthermore, examples are provided solely for purposes of clarity and understanding and are not meant to limit or restrict the disclosed subject matter or relevant portions of this disclosure in any manner. It is to be appreciated that a myriad of additional or alternate examples of a varying scope could have been presented, but have been omitted for purposes of brevity.

The present disclosure provides a method for generating a 3D digital model, based on which model, a physical mold can be generated for manufacturing a custom made hairpiece. Accordingly, the present disclosure also provides a physical mold used in hairpiece manufacturing and a method for generating the same.

Figure 1:
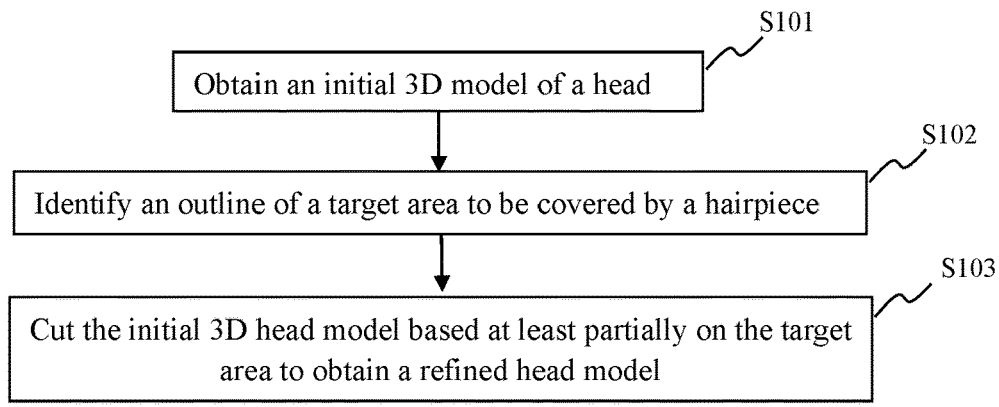
FIG. 1 is a flow chart illustrating an example of a general method for generating a 3D digital model used in hairpiece manufacturing of the present disclosure.

FIG. 1 is a flow chart illustrating a general method for generating a 3D digital model used in hairpiece manufacturing according to some embodiments.

As shown in FIG. 1, in step S101, an initial 3D model of a head is obtained, based on which, an outline of a target area to be covered by a hairpiece is identified in step S102. The target area, for example, may be a hair loss area on a customer's head, and in this case, the outline of the target area lies in where the hairline of the hair loss area lies. The method for generating a 3D digital model of the present disclosure is not limited to any specific way for obtaining the initial 3D model or for identifying the outline of a target area. In step S103, the 3D model is cut based at least partially on the target area to obtain a refined 3D model. Here, "based at least partially on the target area" means the cutting is made in consideration of location, shape, and/or size of the target area with or without other factors.

In the refined 3D model generated with the general method shown in FIG. 1, any geometry that is not needed is removed, and so does the corresponding physical mold generated based on the 3D digital model. This allows a physical mold used in hairpiece manufacturing to be manufactured more effectively with less material and less time, and even allows the mold to be shipped with less cost.

Figure 2:
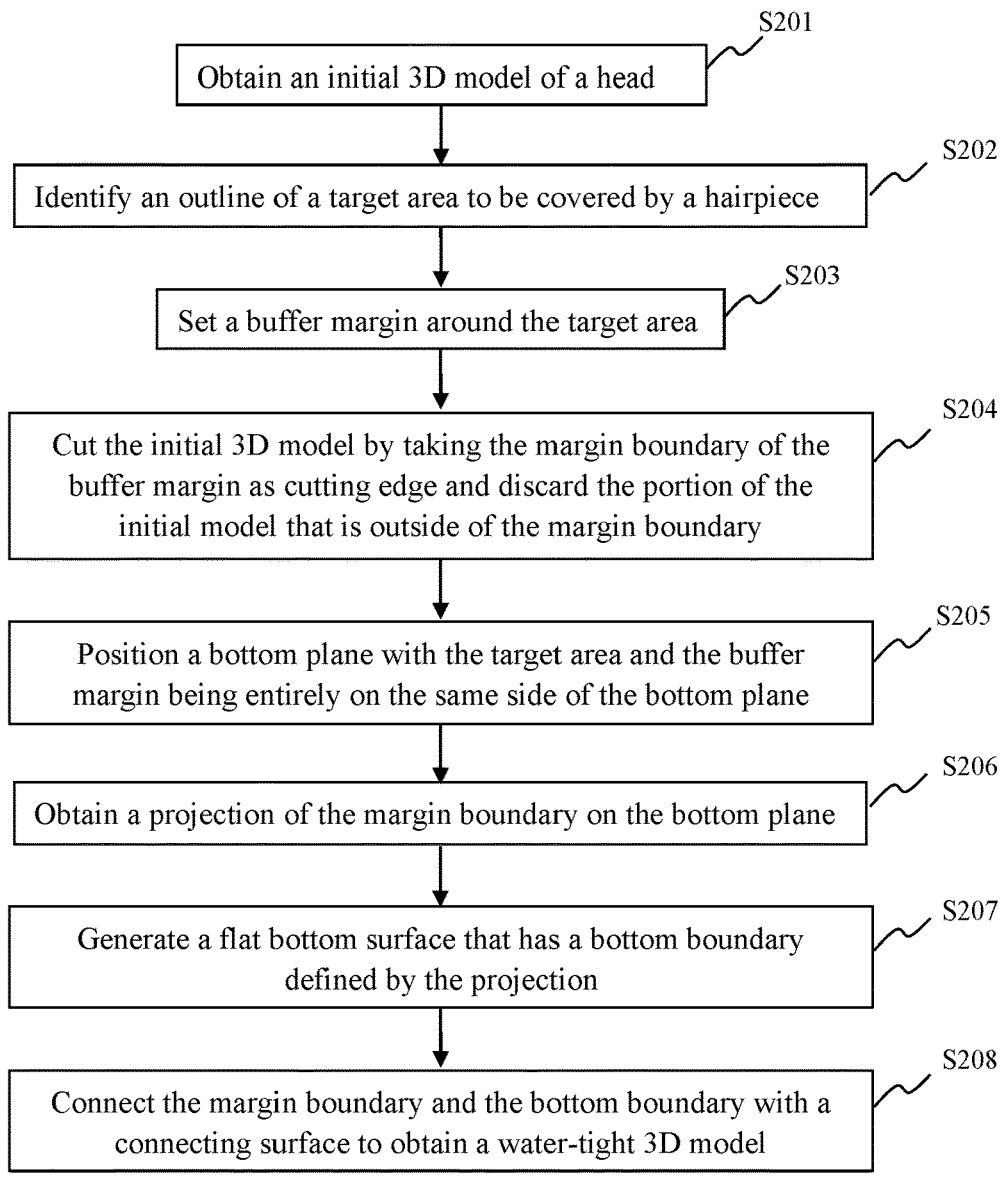
FIG. 2 is a flow chart of a method for generating a 3D digital model according to some embodiments.

According to some embodiments, the method for generating a 3D digital model used in hairpiece manufacturing as shown in FIG. 1 can be implemented as the method shown in FIG. 2, which, to be noted, is given only in an illustrative way, but not limiting. Below, more detailed description of the method shown in FIG. 2 will be made with reference to FIGS. 3-9, which show examples of the 3D models obtained at different steps of the method.

As shown in FIG. 2, in step S201, an initial 3D model of a head is obtained. An initial 3D model may contain 3D geometry information only, or it may contain both 3D geometry information and color information, and the present disclosure is not intended to be limited in this respect. In some embodiments, a head can be measured or scanned three-dimensionally, and the data obtained from the scanning can be sent to a computer and used to build up the initial 3D digital model of the head. For example, a stylus can be used to trace the shape of a head along several lines, and an initial 3D model can be built up based on the data resulting from the tracing and by interpolation. As another example, a binocular camera can be used to capture images of a head from different angles, and these images can then be processed to obtain both 3D geometry information and color information of the head, based on which an initial 3D model can be generated. Preferably, a cap can be put on the head before scanning the head by optical means, which wraps tightly on the head, presses hair, if any, down onto the head shell, and thus presents a contour that conforms to the shape of the head shell. Any other means for presenting a contour that conforms to the shape of a head shell can be used, and the present disclosure is not intended to be limited in this respect. In some other embodiments, an initial 3D digital model of a head, or data that can be transformed into such a 3D model, may already exist, and can be obtained without conducting any 3D measurement/scan of a head. The present disclosure is not intended to be limited to any specific way of obtaining an initial 3D model of a head.

Figure 3:
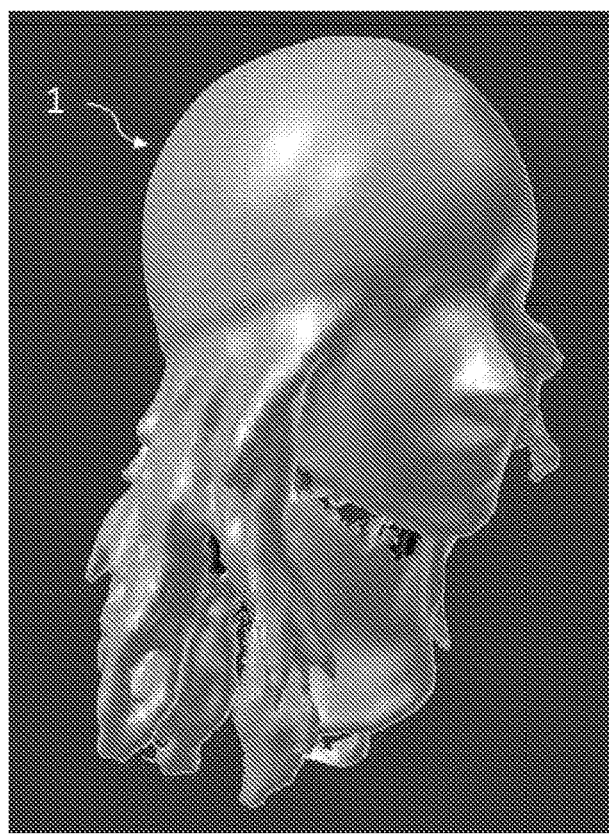
FIG. 3 is a picture showing an example of an initial 3D model of a head.
Figure 4:
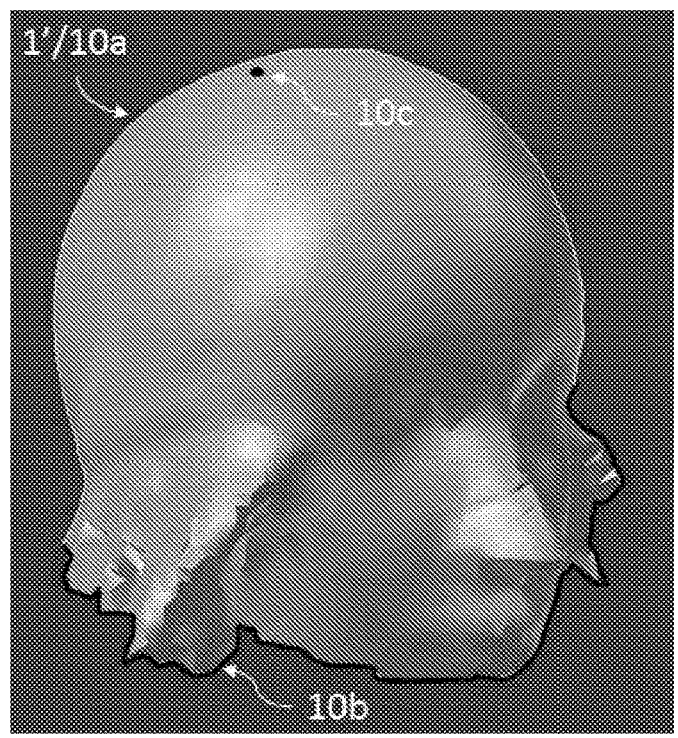
FIG. 4 is a picture showing the 3D model of FIG. 3 with only the relevant geometry remaining.

FIG. 3 shows an example of an initial 3D model of a head. The initial 3D model 1 in this example contains both geometry and color information, but is presented without color information in FIG. 3 for the sake of clarity. FIG. 4 is a picture showing the 3D model of FIG. 3 with only a major geometry 10a remaining.

In the example shown in FIG. 3 and FIG. 4, a major geometry 10a is identified and remained in the model, while the other pieces of geometry are discarded, resulting in a 3D model 1' as shown in FIG. 4. The major geometry 10a, for example, is the one single largest continuous piece of geometry of the initial 3D model 1 shown in FIG. 3. Such a treatment is optional in the method for generating a 3D digital model of the present disclosure. That is, the method can be implemented with or without such a treatment.

Figure 5:
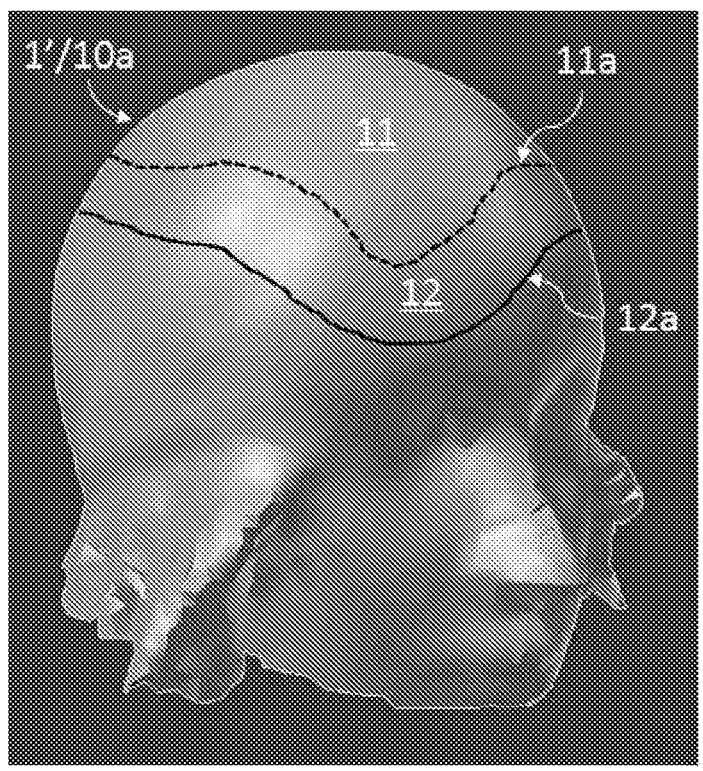
FIG. 5 is a picture showing an example of a 3D model, in which a target area is identified and a buffer margin is set based on the 3D model of FIG. 4.

In step S202, an outline 11a of a target area 11 is identified on the initial 3D model. The target area 11 is an area to be covered by a hairpiece. FIG. 5 illustrates an example of the 3D model 1' with an outline 11a (the topmost of the two lines shown in FIG. 5) of a target area 11 being identified.

Usually, a target area to be covered by a hairpiece is a hair loss area, and in such a case, an outline of the target area is the hairline of the hair loss area. However, here the target area 11 is not limited to a hair loss area, but can be any area that is to be covered by a hairpiece for any reason.

Furthermore, the present disclosure is not intended to be limited in the respect of how to identify an outline 11a of a target area 11. In some embodiments, an outline of a target area can be identified on the initial model 1 or the 3D model 1' manually by an operator. For example, an operator can identify the outline by following a visible line/indication in the initial 3D model 1 or the 3D model 1', which is corresponding to the boundary of a target area. This visible line/indication can be marked on a cap that wraps on the head, and be scanned optically and included into the initial 3D model. In some other embodiments, an outline 11a of a target area 11 can be recognized automatically with an algorithm running in a computer, based on, for example, color information included in the initial 3D model. In yet some other embodiments, the position of outline 11a of a target area 11 may be measured or traced, and specified in an initial 3D model; and information about such position can be extracted from the initial 3D model so as to define/identify the outline.

It can be seen that steps S201 and S202 in the method illustrated in FIG. 2 are corresponding to steps S101 and S102. For implementing steps S103 shown in FIG. 1, the method illustrated in FIG. 2 comprises steps S203 and S204.

A buffer margin 12 is to be set around and adjoining the target area 11 in step S203.

The buffer margin 12 has an outer boundary, which is referred to as "margin boundary" in the context of this application. In the example shown in FIG. 5, the margin boundary is indicated with reference number "12*a*". A buffer margin can be provided for certain purpose, such as, the facilitation of manufacturing a physical mold, and/or a hairpiece by using the physical mold, the prevention of damage to a target area on the physical mold, and/or the provision of a more regular or smoother circumference relative to the outline of the target area.

In some embodiments, a buffer margin can be set to extend a uniform distance from an outline of a target area. For example, as shown in FIG. 5, the margin boundary 12*a* of the buffer margin 12 is separated from the outline 11*a* of the target area 11 by a fixed distance. The "uniform distance" can be determined depending on the purpose for setting such a buffer margin.

In some other embodiments, a buffer margin can be set around a target area in such a manner that the margin boundary is at a uniform distance from an apex of an initial 3D model. In these embodiments, as an example, the method for generating a 3D digital model can further comprise: identifying a major geometry, that is the one single largest continuous piece of geometry of the initial 3D model, in form of a shell; identifying a geometry boundary of the major geometry; and identifying a single point on the major geometry that is the farthest from the geometry boundary as the apex of the initial 3D model. Here, "farthest" means having the largest average distance. Referring back to FIG. 4, in which the geometry boundary and the apex are schematically indicated on the 3D model with reference numbers "10*b*" and "10*c*" respectively, the geometry boundary 10*b* is the open edge of the major geometry 10*a*, and the apex 10*c* of the initial 3D model is substantially the top of the head.

Figure 8:
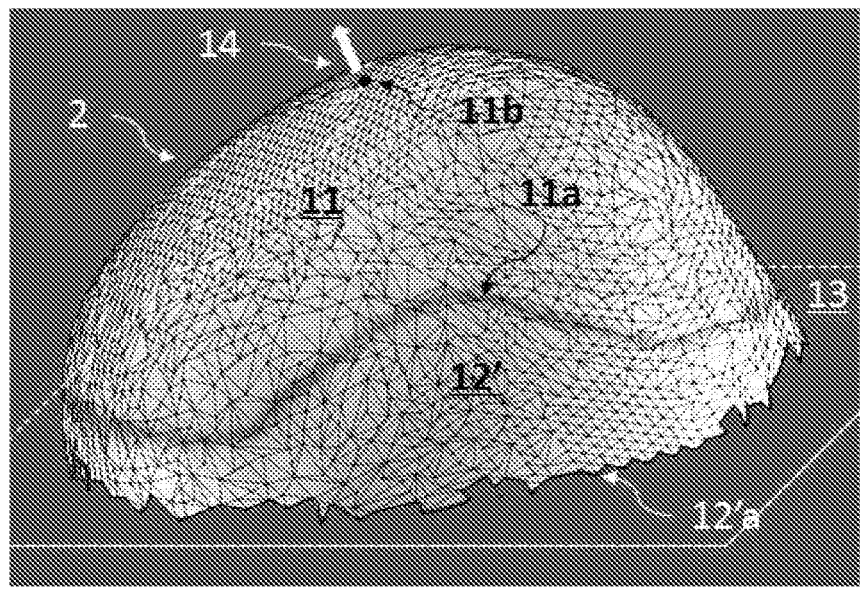
FIG. 8 is a picture showing another example of a refined 3D model, in which a margin boundary is at a uniform distance from an apex of the target area.

In yet some other embodiments, a buffer margin can be set around a target area in such a manner that the margin boundary is at a uniform distance from an apex of the target area. In these embodiments, the method for generating a 3D digital model can further comprise: identifying a single point on the target area that is the farthest from the outline of the target area as an apex of the target area. Also, here, "farthest" means having the largest average distance. FIG. 8 is a picture showing another example of a 3D model, in which a margin boundary is at a uniform distance from an apex 11*b* of the target area 11.

It should be understood that the above embodiments discussed in regards to buffer margin and margin boundary are provided only in an illustrative way, but not limiting.

Referring back to the flow chart of FIG. 2, after setting the buffer margin, in step S204, the initial 3D model is cut by taking the margin boundary of the buffer margin as cutting edge, and the portion of the initial model that is outside of the margin boundary is discarded.

Figure 6:
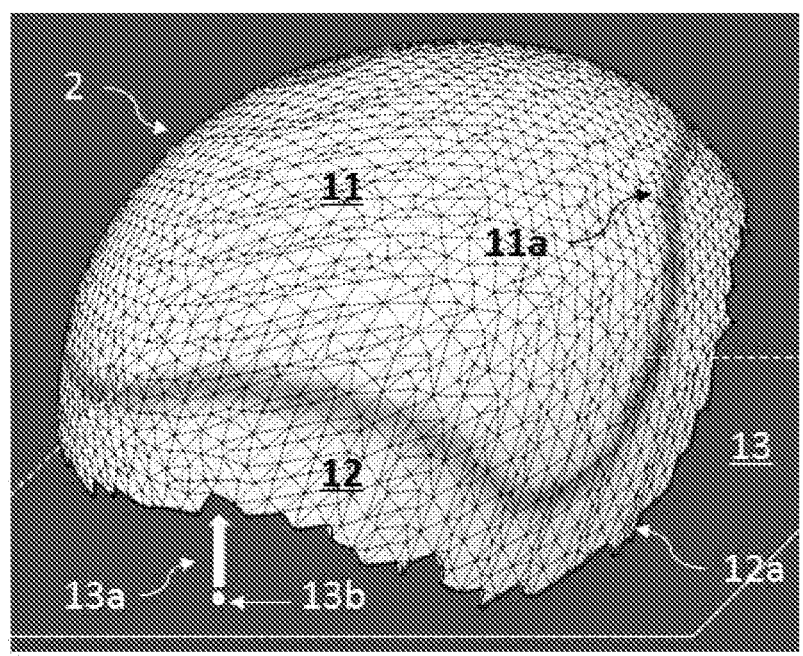
FIG. 6 is a picture showing an example of a refined 3D model obtained after cutting the 3D model of FIG. 5.

FIG. 6 is a picture showing an example of a refined 3D model 2 obtained after cutting the 3D model of FIG. 5 by using the margin boundary of the buffer margin as cutting edge. In FIG. 6, the refined 3D model 2 is presented in a form of a mesh, which spans over the surface of the resulted geometry of the refined 3D model 2. It is well known in the art of 3D modeling that a 3D geometry can be presented both in a form of a continuous surface and a form of a mesh, or in other representations, without substantive difference therebetween.

It can be seen that, with steps S201 to S204 of the method shown in FIG. 2, a refined 3D model 2 is obtained, in which any geometry that is not needed is removed. This allows the amount of material and time used during mold manufacturing to be minimized.

A physical mold can be generated based on the refined 3D model. For generating a physical mold, there are several different approaches. Among others, both 3D printing and milling are available for 3D mold manufacturing and are popular. However, not all 3D molds can be manufactured by 3D printing or milling due to geometry characteristics of the mold design. In consideration of this problem, the method for generating a 3D digital model shown in FIG. 2 optionally comprises steps S205 to S208 to generate a water-tight 3D model based on the refined 3D model, especially a water-tight 3D model with a flat bottom surface, which is usually suitable for 3D printing and/or milling.

In step S205, a bottom plane is positioned in such a manner that the target area and the buffer margin are entirely on the same side of the bottom plane. Given a normal (normal direction), the bottom plane can be positioned so as to make the target area and the buffer margin be at the same side thereof by moving an origin of the bottom plane.

In some embodiments, the normal of the bottom plane can be determined according to the apex of the initial 3D model (e.g. the apex 10*c* shown in FIG. 4). In these embodiments, the method for generating a 3D digital model can further comprise: identifying a major geometry (e.g. the major geometry 10*a* shown in FIG. 4) that is the one single largest continuous piece of geometry of the initial 3D model; identifying a geometry boundary (e.g. the geometry boundary 10*b* shown in FIG. 4) of the major geometry; and identifying a single point on the major geometry that is the farthest from the geometry boundary as the apex of the initial 3D model (e.g. the apex 10*c* shown in FIG. 4). Here, "farthest" means having the largest average distance. It will be understood by those skilled in the art that, these steps for identifying an apex can be carried out at an earlier stage or stages of the process of the method, and/or these steps can be carried out separately at different stages of the process. For example, the major geometry can be identified immediately after obtaining the initial 3D model, and the apex of the initial model can be identified just before setting the buffer margin (for example, in the embodiments where the margin boundary of the buffer margin is at a uniform distance from the apex of the initial 3D model).

As only an example, the normal of the bottom plane can be along a line connecting a barycenter of the geometry boundary of the major geometry and the apex of the initial 3D model. As another example, the normal of the bottom plane can be same as the normal of the surface of initial 3D model at the point of the apex.

In the example illustrated in FIG. 7, a normal 13*a* of the bottom plane 13 is along a line connecting a barycenter (not shown) of the margin boundary and the apex 10*c* of the initial 3D model, and an origin 13*b* of the bottom plane is positioned so as to make the target area 11 and the buffer margin 12 be at the same side of the bottom plane 13.

In some other embodiments, the normal 13*a* of the bottom plane 13 can be determined according to the apex 11*b* of the target area 11 (see FIG. 8). In these embodiments, the method for generating a 3D digital model can further comprise: identifying a single point on the target area that is the farthest from the outline of the target area as an apex of the target area. Also, here, "farthest" means having the largest average distance. This step of identifying the apex 11*b* of the target area 11 can be carried out at an earlier stage of the process of the method for generating a 3D digital model, for example, at a stage immediately after identifying the target area 11.

For example, as shown in FIG. 6, the normal 13a of the bottom plane 13 is determined by a line connecting a barycenter (not shown) of the outline 11a of the target area 11 and the apex 11b of the target area 11, and the origin 13b of the bottom plane 13 is positioned to make the target area 11 and the buffer margin 12' be at the same side of the plane 13. Nevertheless, the normal 13a of the bottom plane 13 can be otherwise determined based on the apex 11b of the target area 11. For example, it can be the same as the normal 14 (in FIG. 8) of the surface of the 3D model at the point of the apex 11b.

In step S206, a projection of the margin boundary on the bottom plane is obtained, and in step S207, a flat bottom surface can be generated by taking the projection as the boundary of the bottom surface, which is referred to as "bottom boundary" in the context of this application. In the example shown in FIG. 7A and FIG. 7B, the margin boundary 12a of the buffer margin 12 is projected onto the bottom plane 13 along a direction of the normal 13a of the bottom plane 13, resulting in a projection 15, and a bottom surface 16 is generated with the projection 15 being taken as the bottom boundary 16a.

Steps S205 to S207 together, provide an exemplary way for providing a flat bottom surface, and the method for generating a 3D digital model according to embodiments of the present disclosure is not limited in this respect. For example, the bottom plane can be set manually by an operator, who observes the orientation and position of the bottom plane on a display and adjusts them manually as he/she thinks appropriate. As for the bottom boundary, for instance, it can have a predetermined figure such as a circle or a square, instead of being defined by a projection of the margin boundary on the bottom plane. The flat bottom surface can even be provided without generating a bottom plane. For example, a predetermined flat bottom surface having a circular bottom boundary can be provided and manually positioned by an operator, who observes the orientation and position of the bottom surface on a display and adjusts them manually.

Figure 7A:
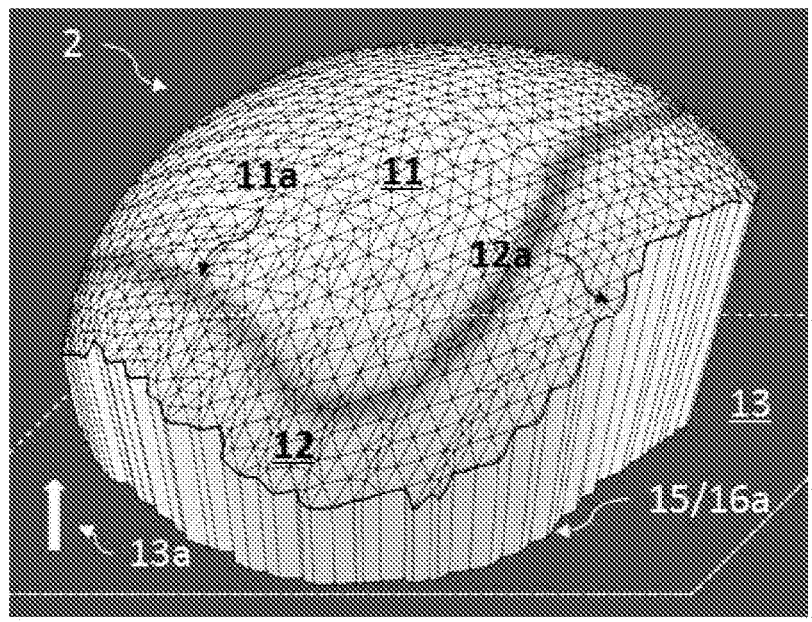
FIG. 7A and FIG. 7B are pictures showing an example of a water-tight 3D model obtained, based on the refined 3D model of FIG. 6.
Figure 7B:
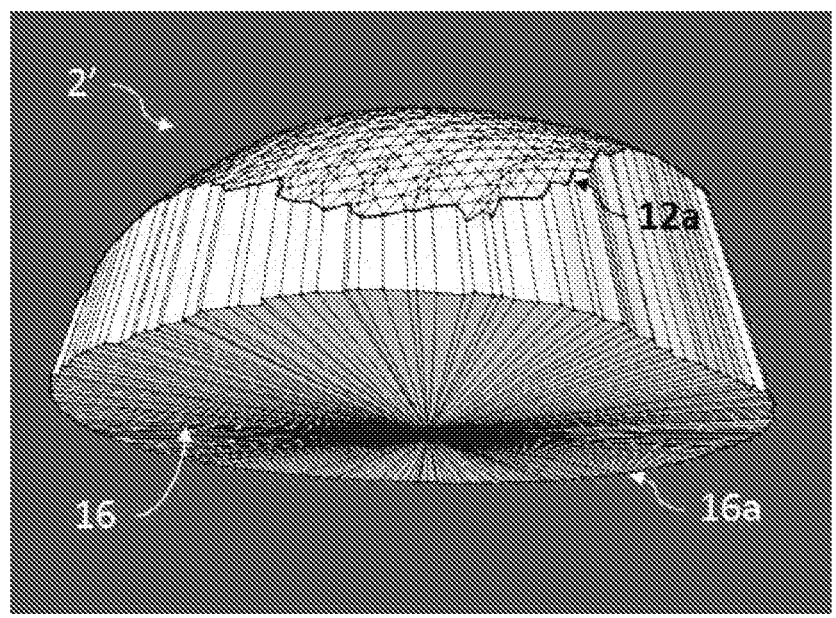
Figure 9:
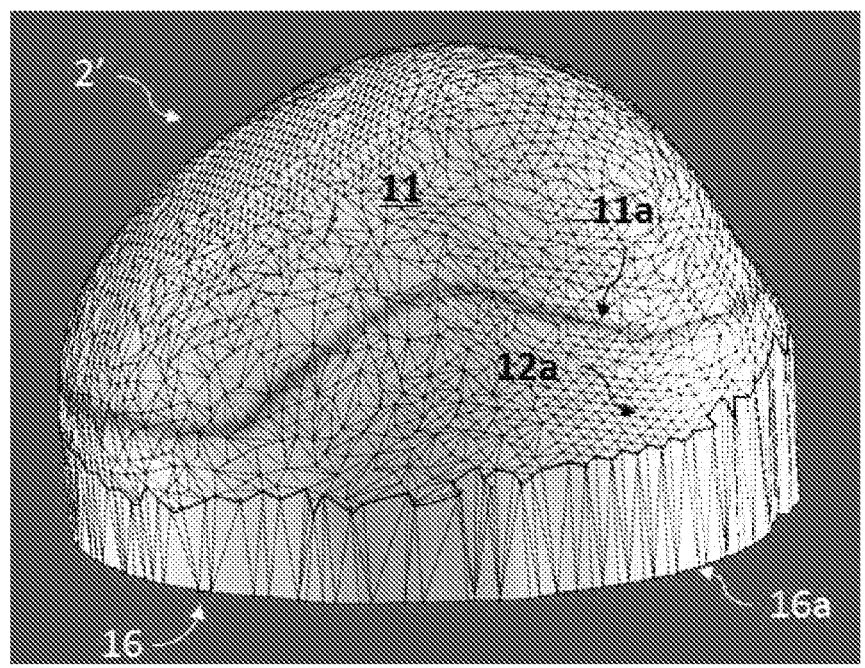
FIG. 9 is a picture showing an example of a water-tight 3D model obtained, based on the refined 3D model of FIG. 8.

Then, in step S208, a water-tight 3D model can be obtained by connecting the margin boundary and the bottom boundary with a connecting surface. FIG. 7A, FIG. 7B, and FIG. 9 show examples of water-tight 3D models 2' obtained based on the refined models 2 of FIG. 6 and FIG. 8, respectively. The 3D digital model is made water-tight in an advantageous way by providing a flat bottom surface to build from when printing in 3D without significant overhangs, which simplifies the printing process and reduces cost.

Figure 10:
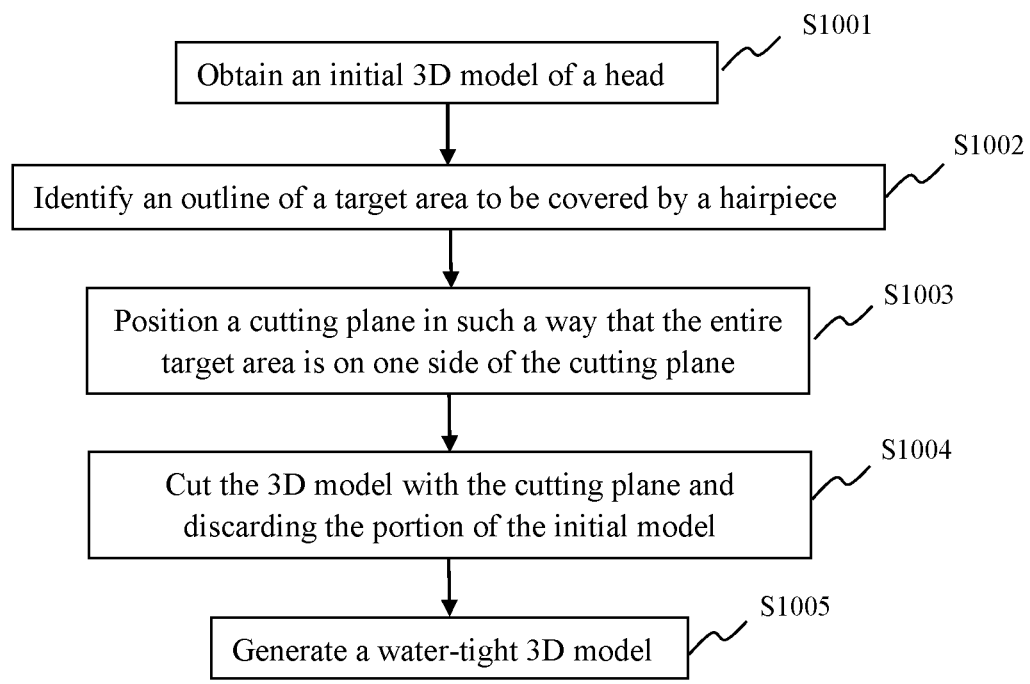
FIG. 10 is a flow chart of a method for generating a 3D digital model according to some other embodiments.

According to some other embodiments, the method for generating a 3D digital model used in hairpiece manufacturing as shown in FIG. 1 can also be implemented as the method shown in FIG. 10, which, to be noted, is given only in an illustrative way, but not limiting.

As shown in FIG. 10, an initial 3D model of a head is obtained in step S1001; and an outline of a target area to be covered by a hairpiece is identified on the initial 3D model in step S1002. Steps S1001 and S1002 are corresponding to steps S101 and S102, and can be implemented as the same as steps S201 and S202 in the method shown in FIG. 2, and thus detailed explanation thereof is omitted here for the sake of brevity.

For implementing step S103 shown in FIG. 1, the method illustrated in FIG. 10 comprises steps S1003 and S1004.

In step S1003, a cutting plane is set in such a manner that the entire target area is on one side of the cutting plane; and in step S1004, the initial 3D model is cut with the cutting plane and the portion of the initial model that is on the other side of the cutting plane is discarded, resulting in a refined 3D model.

A cutting plane can be set in the same manner as a bottom plane (e.g. the bottom plane 13 shown in FIGS. 6, 7A, and 8). Similar to what was discussed above with regard to step S205 of the method shown in FIG. 2, given the normal and origin, a cutting plane is fully specified. In some embodiments, the normal of the cutting plane can be determined according to the apex of the initial 3D model or the apex of the target area. As an example, the normal of the cutting plane can be along a line connecting a barycenter of a boundary of the major geometry and the apex of the initial 3D model. As another example, the normal of the bottom plane can be the same as the normal of the surface of 3D model at the point of the apex. In some other embodiments, the cutting plane can be set manually by an operator, who may observe the orientation and position of the plane on a display and adjust them manually as he/she thinks appropriate.

Figure 11:
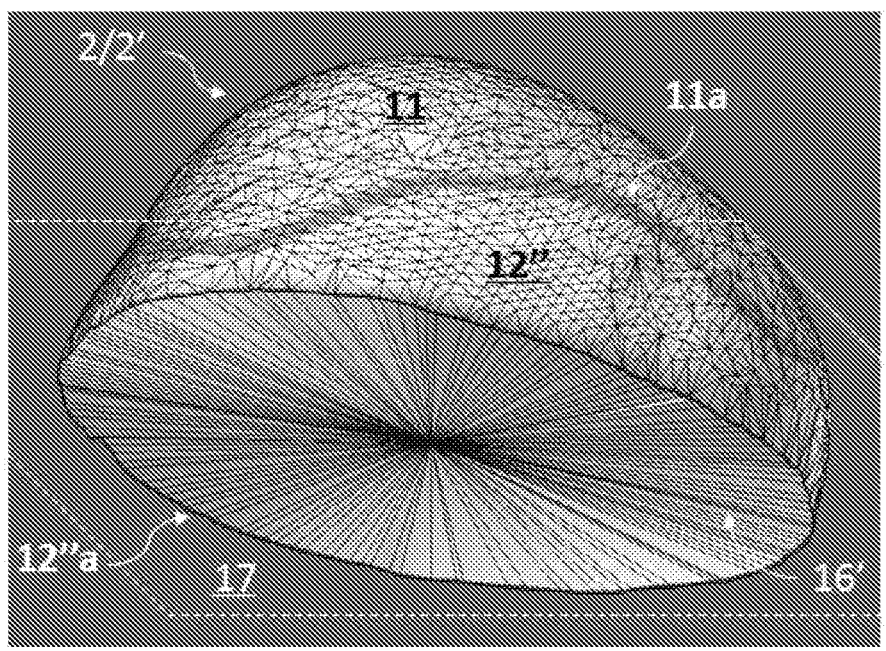
FIG. 11 is a picture showing an example of a water-tight 3D model obtained through the method shown in FIG. 10.

Referring to FIG. 11, the refined 3D model obtained in step S1004 comprises a portion that is around the target area, which can also be deemed as a buffer margin 12". This buffer margin 12" has a margin boundary 12"a that is defined by the line of section, where the initial 3D model 1 or the 3D model 1' intersects the cutting plane 17.

A physical mold can be generated based on the refined 3D model 2 which is a result of step S1004. For facilitating 3D printing or milling of a physical mold, the method for generating a 3D digital model shown in FIG. 10 can optionally further comprise step S1005 to generate a water-tight 3D model based on the refined 3D model.

In some embodiments, step S1005 can comprise steps that are the same as steps S205 to S208 of the method illustrated in FIG. 2 so as to generate a water-tight 3D model. Detailed description of the steps is omitted here for the sake of brevity.

In some other embodiments, as shown in FIG. 11, in step S1005, a water-tight 3D model 2' can be obtained by generating a flat bottom surface 16' that has a boundary 12"a defined by the boundary created by separating for example the initial 3D model 1 with the cutting plane 17. Since the buffer margin 12" and the bottom surface 16' have the same boundary 12"a, the 3D model of FIG. 11 is closed in boundary, resulting in a water-tight model 2'.

In the example shown in FIG. 11, a normal of the cutting plane 17 can be set to be the same as the normal (not shown) of the surface of the 3D model at the point of the apex of the target area, and the bottom surface has the same boundary as the buffer margin.

The present disclosure also provides a physical mold used in hairpiece manufacturing and a method for generating the physical mold.

This method for generating a physical mold is based on the method for generating a 3D digital model discussed above, and comprises:
  a) obtaining an initial 3D model of a head;
  b) identifying an outline of a target area to be covered by a hairpiece on the initial 3D model;
  c) cutting the initial 3D model based at least partially on the target area to obtain a refined 3D model; and
  d) generating a physical mold based on the refined 3D model.

For the above steps a, b, and c, reference can be made to the discussion above with regard to the methods illustrated in FIG. 1, FIG. 2 and FIG. 10, and a detailed explanation thereof is omitted here for the sake of brevity.

In some embodiments, the above step d, that is, generating a physical mold based on the refined 3D model, can comprise: generating a water-tight 3D model by connecting a boundary of the refined 3D model to a flat bottom surface; and generating the physical mold based on the water-tight 3D model. Preferably, the physical mold is 3D printed or milled based on the water-tight 3D model.

Figure 12:
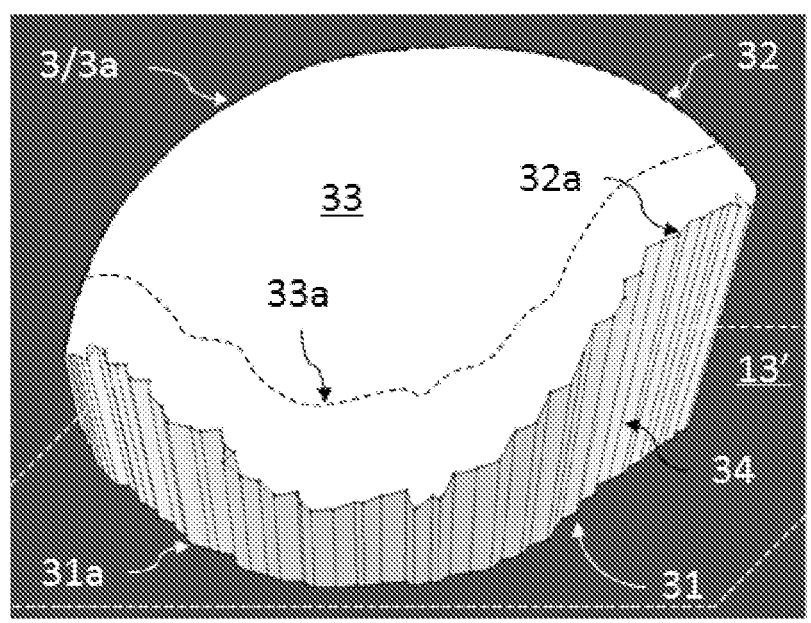
FIG. 12 is a picture showing an example of a physical mold of the present disclosure.

The physical mold provided according to embodiments of the present disclosure, can be used in hairpiece manufacturing. As shown in FIG. 12, the physical mold 3 comprises a body 3a, having a bottom surface 31 and a top surface 32 (corresponding to the target area and the buffer margin in combination in the 3D digital model), wherein the top surface 32 is corresponding to only a part of a head shell, and contains a target area 33 to be covered by a hairpiece, and the top surface 32 has a top boundary 32a (corresponding to the margin boundary in the 3D digital model) that is set based at least partially on the target area. Preferably, the bottom surface is flat.

In some embodiments, as shown in FIG. 12, the top boundary 32a of the top surface 32 is at a uniform distance from a outline 33a of the target area 33. In some other embodiments, the top boundary 32a of the top surface 32 can be at a uniform distance from an apex (not shown) of the target area 33.

In some embodiments, the bottom surface 31 has a bottom boundary 31a that is result of the projection of the top boundary of the top surface onto a plane 13' (corresponding to the bottom plane in the 3D digital model) in which the bottom surface 31 lies, in a direction of the normal of said plane. The bottom boundary 31a and the top boundary 32a can be connected by a connecting surface 34, which extends between the bottom boundary 31a and the top boundary 32a in the direction of the normal of said plane 13'.

Detailed description of the method for generating a 3D digital model used in hairpiece manufacturing, the method for generating a physical model and the physical mold used in hairpiece manufacturing according to embodiments of the present disclosure has been made above with reference to the figures.

According to another aspect of the present disclosure, one or more processor readable storage devices are disclosed, which have encoded thereon instructions for causing one or more processors to perform the method for generating a 3D digital model used in hairpiece manufacturing as described above, alone or in any combination.

According to yet another aspect of the present disclosure, a system is disclosed, which comprises: one or more processors and one or more processor readable storage devices, wherein the one or more processor readable storage devices have encoded thereon instructions for causing the one or more processors to perform the method for generating a 3D digital model used in hairpiece manufacturing as described above, alone or in any combination.

It should be noted that although the operation of the method is described in a particular order in the drawings, this does not require or imply that the operations must be performed in that particular order, or that all of the operations shown must be performed in order to achieve the desired result. In contrast, the steps depicted in the flowchart can change their execution order. Additionally or alternatively, certain steps can be omitted, a plurality of steps can be combined into one step, and/or a step can be decomposed into a plurality of steps.

The foregoing description is only exemplary embodiments of the present application and a description of the technical principles of the application. It should be understood by those skilled in the art that the scope of the invention recited in this application is not limited to the technical solutions formed by the specific combination of the above-described technical features, and should also encompass other technical solutions formed by any combination of the above technical features or their equipollent features. For example, the technical solutions can be those formed through the mutual substitution between the above-mentioned features and the technical features disclosed in the present application (but not limited thereto) having similar functions.

What is claimed is:

1. A method for generating a 3D digital model used in hairpiece manufacturing, comprising:
    obtaining an initial 3D model of a head;
    identifying an outline of a target area to be covered by a hairpiece on the initial 3D model; and
    cutting the initial 3D model based at least partially on the target area to obtain a refined 3D model,
    wherein
    said cutting the initial 3D model based at least partially on the target area comprises:
        setting a buffer margin around the target area, which has a margin boundary; and
        cutting the initial 3D model by taking the margin boundary as cutting edge and discarding a portion of the initial 3D model that is outside of the margin boundary, and
    the method further comprises: generating a water-tight 3D model by providing a flat bottom surface and connecting the margin boundary to the flat bottom surface with a connecting surface.

2. The method of claim 1, further comprising:
    generating the water-tight 3D model based on the refined 3D model.

3. The method of claim 2, wherein said generating the water-tight 3D model based on the refined 3D model comprises generating the water-tight 3D model by connecting a boundary of the refined 3D model to the flat bottom surface.

4. The method of claim 1, wherein the buffer margin is set to extend a uniform distance from the outline.

5. The method of claim 1, wherein the flat bottom surface is provided by:
    positioning a bottom plane in such a manner that the target area and the buffer margin are entirely on the same side of the bottom plane;
    obtaining a projection of the margin boundary on the bottom plane; and
    generating the flat bottom surface that has a bottom boundary defined by the projection.

6. The method of claim 5, wherein the bottom plane has a normal that is determined based on an apex of the initial 3D model.

7. The method of claim 6, further comprising:
    identifying a major geometry that is a one single largest continuous piece of geometry of the initial 3D model;
    identifying a geometry boundary of the major geometry; and
    identifying a single point on the major geometry that is the farthest from the geometry boundary as the apex of the initial 3D model.

8. The method of claim 7, wherein the margin boundary of the buffer margin is set to be at a uniform distance from the apex of the initial 3D model.

9. The method of claim 5, further comprising:
identifying a single point on the target area that is the farthest from the outline of the target area as an apex of the target area; and
wherein the bottom plane has a normal that is determined based on the apex of the target area.

10. The method of claim 9, wherein the buffer margin is set to extend a uniform distance from the apex of the target area.

11. One or more non-transitory processor readable storage devices having encoded thereon instructions for causing one or more processors to perform the method of claim 1 for generating the 3D digital model used in the hairpiece manufacturing.

12. A system for generating a 3D digital model used in hairpiece manufacturing, the system comprising: one or more processors and one or more non-transitory processor readable storage devices, wherein the one or more processor readable storage devices have encoded thereon instructions for causing the one or more processors to perform the method of claim 1 for generating the 3D digital model used in the hairpiece manufacturing.

13. A method for generating a 3D digital model used in hairpiece manufacturing, comprising:
obtaining an initial 3D model of a head;
identifying an outline of a target area to be covered by a hairpiece on the initial 3D model; and
cutting the initial 3D model based at least partially on the target area to obtain a refined 3D model,
wherein
said cutting the initial 3D model based at least partially on the target area comprises:
setting a cutting plane in such a manner that an entire target area is on one side of the cutting plane; and
cutting the initial 3D model with the cutting plane and discarding a portion of the initial 3D model that is on another side of the cutting plane, and
the method further comprises: generating a water-tight 3D model by generating a flat bottom surface that has a boundary defined by a line of a section of the initial 3D model with the cutting plane.

14. The method of claim 13, wherein said setting the cutting plane comprises determining a normal of the cutting plane based at least partially on an apex of the initial 3D model or an apex of the target area.

* * * * *